US012210808B2

(12) United States Patent
Lee et al.

(10) Patent No.: US 12,210,808 B2
(45) Date of Patent: Jan. 28, 2025

(54) SYSTEMS AND METHODS FOR INVESTIGATING INTERACTIONS BETWEEN SIMULATED HUMANS

(71) Applicant: Toyota Research Institute, Inc., Los Altos, CA (US)

(72) Inventors: Matthew Lee, Mountain View, CA (US); Shabnam Hakimi, Chape Hill, NC (US); Nikos Arechiga, San Mateo, CA (US); Charlene C. Wu, San Francisco, CA (US)

(73) Assignee: Toyota Research Institute, Inc., Los Altos, CA (US)

( * ) Notice: Subject to any disclaimer, the term of this patent is extended or adjusted under 35 U.S.C. 154(b) by 238 days.

(21) Appl. No.: 17/470,727

(22) Filed: Sep. 9, 2021

(65) Prior Publication Data

US 2023/0071550 A1    Mar. 9, 2023

(51) Int. Cl.
  G06F 30/27 (2020.01)
  G06N 3/006 (2023.01)

(52) U.S. Cl.
  CPC ............. G06F 30/27 (2020.01); G06N 3/006 (2013.01)

(58) Field of Classification Search
  CPC ................................ G06F 30/27; G06N 3/006
  See application file for complete search history.

(56) References Cited

U.S. PATENT DOCUMENTS

| 2004/0018477 A1* | 1/2004 | Olsen ..................... G09B 5/065 434/307 R |
| 2015/0042663 A1* | 2/2015 | Mandel ................... G06N 5/02 345/474 |
| 2019/0259292 A1* | 8/2019 | Williams .......... G06F 18/24323 |
| 2020/0167607 A1* | 5/2020 | McConachie ........ G06Q 10/067 |
| 2022/0366244 A1* | 11/2022 | Vandeventer ...... G06Q 10/0639 |

FOREIGN PATENT DOCUMENTS

| JP | 2003205483 A | 7/2003 |
| JP | 2008502488 A | 1/2008 |
| JP | 6814118 B2 | 1/2021 |
| KR | 20030073429 A | 9/2003 |
| KR | 100767170 B1 | 10/2007 |
| WO | 2009102970 A2 | 8/2009 |

* cited by examiner

*Primary Examiner* — Sherrod L Keaton
(74) *Attorney, Agent, or Firm* — Dinsmore & Shohl LLP (57) ABSTRACT

A system includes a processor configured to build a model of human behavior that can be assigned to a simulated human, where the model is trained on a dataset of interactions between humans, and parameters of the model can be adjusted. The processor is further configured to build a model of a task to be engaged in by a plurality of simulated humans, simulate interactions between the plurality of simulated humans, and display behavior of the simulated humans and information about the interactions between the simulated humans during simulated interactions.

15 Claims, 5 Drawing Sheets

- Number of Simulated Humans: [2 ▾]

Simulated Human 1
- Model: [Male ▾] [25-30 ▾] [College Grad ▾]
- Parameters
  Forthcoming [4 ▾]
  Perceptive [6 ▾]
  Trusting [7 ▾]
  Economical [5 ▾]
  Impressionable [5 ▾]

- Task Type: [Negotiation ▾]
  [Sale/Purchase ▾]
  [Vehicle ▾]

- Roles
  Simulated Human 1 [BUYER ▾]
  Simulated Human 2 [SELLER ▾]

- Global Parameters
  Interested 3rd Party Buyers [Y ▾]
- Simulated Human 1 Task Parameters
  Upper Spending Limit [$30,000 ▾]
- Simulated Human 2 Task Parameters
  Unwilling to sell for less than [$28,000 ▾]

SYSTEMS AND METHODS FOR INVESTIGATING INTERACTIONS BETWEEN SIMULATED HUMANS

TECHNICAL FIELD

The present specification generally relates to systems and methods for investigating interactions between simulated humans.

BACKGROUND

Investigating interactions between humans may be of interest for sociological and psychological considerations. Such investigations may be difficult to conduct in real life, however. For instance, only so many experiments or observations may be run based on the availability of research participants. Moreover, it is difficult to control or account for all personal and environmental variables in such experiments. It is not feasible for an investigator to run enough experiments to determine how each personality variable of the research participants or environmental factor surrounding the interaction between the participants influences their interactions with each other.

Accordingly, a need exists for systems and methods that allow for the investigation of interactions between simulated humans.

SUMMARY

In one embodiment, a system includes a processor configured to build a model of human behavior that can be assigned to a simulated human, where the model is trained on a dataset of interactions between humans, and parameters of the model can be adjusted. The processor is further configured to build a model of a task to be engaged in by a plurality of simulated humans, simulate interactions between the plurality of simulated humans, and display behavior of the simulated humans and information about the interactions between the simulated humans during simulated interactions.

In another embodiment, a method implemented by a processor of a device includes building a model of human behavior that can be assigned to a simulated human, where the model is trained on a dataset of interactions between humans, and parameters of the model can be adjusted. The method further includes building a model of a task to be engaged in by a plurality of simulated humans, simulating interactions between the plurality of simulated humans, and displaying behavior of the simulated humans and information about the interactions between the simulated humans during simulated interactions.

In yet another embodiment, a processor of a computing device is configured to build a model of human behavior that can be assigned to a simulated human, where the model is trained on a dataset of interactions between humans, and parameters of the model can be adjusted. The processor is further configured to build a model of a task to be engaged in by a plurality of simulated humans, simulate interactions between the plurality of simulated humans, and display behavior of the simulated humans and information about the interactions between the simulated humans during simulated interactions.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments described herein are directed to systems and methods for investigating interactions between simulated humans. The system builds a model of human behavior that can be assigned to a simulated human. The model of human behavior is trained on a dataset of interactions between humans. Parameters of the model of human behavior may be adjusted by a user. Accordingly, depending on the dataset used to train each model of human behavior and the selective adjustment of one or more parameters of the model, a user can accurately control, isolate, and investigate personality variables of the simulated human. The system also builds a model of a task to be engaged in by a plurality of simulated humans. The task may include a goal to be achieved by each of the plurality of simulated humans. The user may also adjust parameters of the model of the task to be engaged in to allow the user to accurately control, isolate, and investigate environmental or contextual variables in the task to be engaged in. The system simulates interactions between the plurality of simulated humans. Throughout the simulation, the system displays behavior of the simulated humans and information about the interactions between the simulated humans, such as their internal emotional, mental, or physiological states. Various embodiments of system for investigating interactions between simulated humans and the operation of the system are described in more detail herein. Whenever possible, the same reference numerals will be used throughout the drawings to refer to the same or like parts.

Figure 1:
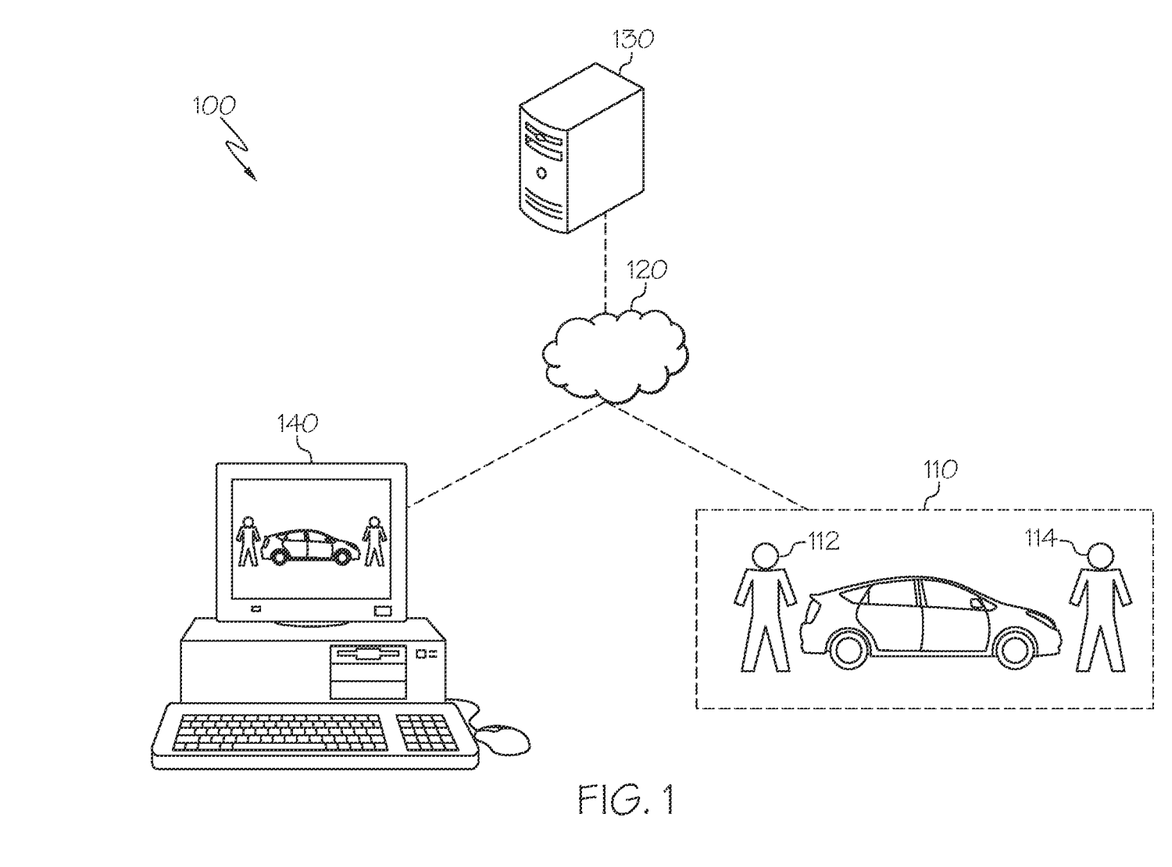
FIG. 1 schematically depicts an example operating environment of the system for investigating interactions between simulated humans of the present disclosure, according to one or more embodiments shown and described herein.

Referring now to the drawings, FIG. 1 schematically depicts an example operating environment of a system 100 for investigating interactions between simulated humans, according to one or more embodiments shown and described herein. As illustrated, FIG. 1 depicts a first human 112 and a second human 114 interacting within an environment 110. Data on the first human 112, the second human 114, and the environment 110 may be uploaded to an external device 130 and/or a user device 140 through a network 120. The user device 140 may be used to perform one or more user-facing functions, such as receiving one or more inputs from a user or providing information to a user. The user device 140 may be a cellular phone, tablet, or personal computer. The user device 140 includes a processor for investigating interactions between simulated humans.

Figure 2:
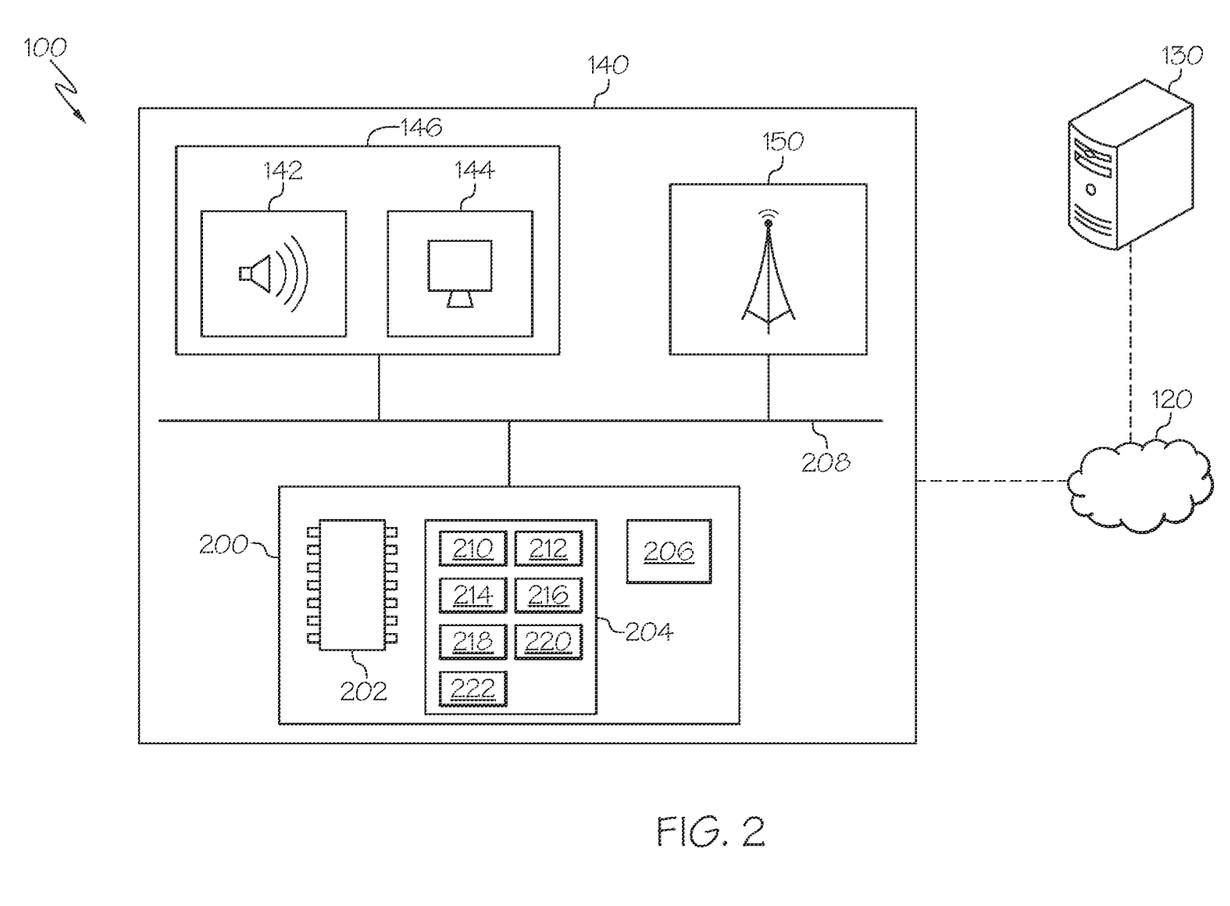
FIG. 2 schematically depicts non-limiting components of the devices of the system for investigating interactions between simulated humans of the present disclosure, according to one or more embodiments shown and described herein.

Referring now to FIG. 2, non-limiting components of the user device 140 of the system 100 for investigating interactions between simulated humans of the present disclosure are schematically depicted, according to one or more embodiments shown and described herein. The user device 140 includes a controller 200 including a processor 202, a memory module 204, and a data storage component 206. The user device 140 may further include an interface module 146, a network interface hardware 150, and a communication path 208. It should be understood that the user device 140 of FIG. 2 is provided for illustrative purposes only, and that other user devices 140 comprising more, fewer, or different components may be utilized.

Referring now to FIGS. 1 and 2, the processor 202 may be any device capable of executing machine readable and executable instructions. Accordingly, the processor 202 may be a controller, an integrated circuit, a microchip, a computer, or any other computing device. The controller 200, including the processor 202, is coupled to the communication path 208 that provides signal interconnectivity between various modules of the user device 140. Accordingly, the communication path 208 may communicatively couple any number of processors 202 within the user device 140 with one another, and allow the modules coupled to the communication path 208 to operate in a distributed computing environment. Specifically, each of the modules may operate as a node that may send and/or receive data. As used herein, the term "communicatively coupled" means that coupled components are capable of exchanging data signals with one another such as, for example, electrical signals via conductive medium, electromagnetic signals via air, optical signals via optical waveguides, and the like.

Accordingly, the communication path 208 may be formed from any medium that is capable of transmitting a signal such as, for example, conductive wires, conductive traces, optical waveguides, or the like. In some embodiments, the communication path 208 may facilitate the transmission of wireless signals, such as WiFi, Bluetooth®, Near Field Communication (NFC) and the like. Moreover, the communication path 208 may be formed from a combination of mediums capable of transmitting signals. In one embodiment, the communication path 208 comprises a combination of conductive traces, conductive wires, connectors, and buses that cooperate to permit the transmission of electrical data signals to components such as processors, memories, sensors, input devices, output devices, and communication devices. Additionally, it is noted that the term "signal" means a waveform (e.g., electrical, optical, magnetic, mechanical or electromagnetic), such as DC, AC, sinusoidal-wave, triangular-wave, square-wave, vibration, and the like, capable of traveling through a medium.

The controller 200 of the user device 140 includes the memory module 204. The controller 200, including the memory module 204, is coupled to the communication path 208. The memory module 204 may comprise RAM, ROM, flash memories, hard drives, or any device capable of storing machine readable and executable instructions such that the machine readable and executable instructions can be accessed by the processor 202. The machine readable and executable instructions may comprise logic or algorithm(s) written in any programming language of any generation (e.g., 1GL, 2GL, 3GL, 4GL, or 5GL) such as, for example, machine language that may be directly executed by the processor, or assembly language, object-oriented programming (OOP), scripting languages, microcode, etc., that may be compiled or assembled into machine readable and executable instructions and stored on the memory module 204. Alternatively, the machine readable and executable instructions may be written in a hardware description language (HDL), such as logic implemented via either a field-programmable gate array (FPGA) configuration or an application-specific integrated circuit (ASIC), or their equivalents. Accordingly, the methods described herein may be implemented in any conventional computer programming language, as pre-programmed hardware elements, or as a combination of hardware and software components.

Still referring to FIGS. 1 and 2, the user device 140 comprises network interface hardware 150 for communicatively coupling the user device 140 to the external device 130. The network interface hardware 150 can be communicatively coupled to the communication path 208 and can be any device capable of transmitting and/or receiving data via a network. Accordingly, the network interface hardware 150 can include a communication transceiver for sending and/or receiving any wired or wireless communication. For example, the network interface hardware 150 may include an antenna, a modem, LAN port, Wi-Fi card, WiMax card, mobile communications hardware, near-field communication hardware, satellite communication hardware and/or any wired or wireless hardware for communicating with other networks and/or devices. In one embodiment, the network interface hardware 150 includes hardware configured to operate in accordance with the Bluetooth® wireless communication protocol. The network interface hardware 150 of the user device 140 may transmit information on the investigation of interactions between simulated humans to the external device 130. The network interface hardware 150 may also receive information and data relating to the investigation of interactions between simulated humans from the external device 130.

In some embodiments, the user device 140 may be communicatively coupled to the external device 130 by the network 120. In one embodiment, the network 120 may include one or more computer networks (e.g., a personal area network, a local area network, or a wide area network), cellular networks, satellite networks and/or a global positioning system and combinations thereof. Accordingly, the user device 140 can be communicatively coupled to the network 120 via a wide area network, via a local area network, via a personal area network, via a cellular network, via a satellite network, etc. Suitable local area networks may include wired Ethernet and/or wireless technologies such as, for example, wireless fidelity (Wi-Fi). Suitable personal area networks may include wireless technologies such as, for example, IrDA, Bluetooth®, Wireless USB, Z-Wave, ZigBee, and/or other near field communication protocols. Suitable cellular networks include, but are not limited to, technologies such as LTE, WiMAX, UMTS, CDMA, and GSM.

The external device 130 may be any database server or electronic device belonging to a user of the user device 140 or a third party. For instance, the external device 130 may contain one or more storage devices for storing data pertaining to the operation of the system 100 for investigating interactions between simulated humans. The external device 130 may function as a general database for transmitting data relating to the first human 112, the second human 114, and the environment 110 the first human 112 and the second human 114 interact in. That is, the external device 130 stores and transmits data related to real-world interactions between one or more humans. As used herein, a real-world interaction between one or more humans may be also be referred to as a trial. A single trial relates to a period of interaction between two or more humans contextualized by a constant purpose. For instance, the first human 112 may be an individual wishing to buy a car, and the second human 114 may be an individual wishing to sell a car. The first human 112 and the second human 114 may communicate, verbally or non-verbally, for a period of ten minutes. If, for the entire ten minutes, the first human 112 and the second human 114 communicate regarding the sale/purchase of a vehicle in question, then the entire ten minutes may be considered a first trial, as the entire period of interaction is contextualized by the constant purpose of selling/purchasing the vehicle. If, on the other hand, the first human 112 and the second human 114 communicate regarding the sale/purchase of the vehicle for the first five minutes, and then communicate about their past weekends for the second five minutes, the first five minutes may be considered a first trial, and the second five minutes may be considered a second trial.

The data stored and transmitted by the external device 130 may be collected from one or more physiological sensors worn by, or otherwise situated to collect data on, the first human and the second human. The physiological sensors may include a heart rate sensor, a blood pressure sensor, a sweat sensor, a facial expression recognition sensor, a pupil dilation sensor, an EKG sensor, an EEG sensor, and the like. The physiological data on the first human 112 and the second human 114 may be directly transmitted from the one or more physiological sensors to the external device 130 through the network 120. In other embodiments, the sensors may be associated with one or more network-connected devices, such as a cellular device, smart watch, and the like, of the first human 112 and/or the second human 114. In such cases, the data from the physiological sensors may be directly collected by the one or more network-connected devices, which may then transmit the physiological data to the external device 130.

Separate trials between the first human 112 and the second human 114 may be time stamped, for instance. In one example, an administrator, or individual who observes the communication trial between the first human 112 and the second human 114, may record when trials begin and end and upload such recordings to the external device 130. Therefore, physiological data collected over ten minutes of communication, and two separate trials, between the first human 112 and the second human 114 may be correctly associated with the trial the individual trial the physiological data was collected during. The administrator may also label the each trial with its constant purpose, such as, a negotiation for sale, an election of a group leader, and the like.

In addition to, or instead of, the physiological data on the first human 112 and the second human 114, the external device 130 may also store voice of video recordings of the first human 112 and the second human 114 during the trial. For instance, the dialogue and physical interactions of the first human 112 and the second human 114 may be recorded by any suitable audio or video recording device and uploaded to the external device 130.

The administrator, or individual observing the communication trial between the first human 112 and the second human 114 may upload administrator notes on the trial between the first human 112 and the second human 114. The administrator notes may be objective observations of the first human 112, the second human 114, and/or the environment 110. For instance, if the trial is contextualized by the purpose of the purchase/sale of a vehicle, the administrator may record where the trial is taking place (at a car lot, at a home of the first human 112 or the second human 114, etc.), the number of people surrounding the first human 112 and the second human 114, the weather, and any other observable variable in the environment 110. The administrator notes may also relate to the interactions communications between the first human 112 and the second human 114. For instance, the administrator may record the order of offer/counteroffer between the first human 112 and the second human 114, the change in price of the vehicle with each offer/counteroffer, and the like.

The administrator may also upload administrator analysis on the trial between the first human 112 and the second human 114. The administrator analysis may be subjective observations of the first human 112, the second human 114, and/or the environment 110. For instance, the administrator may observe the vocal inflections, facial expressions, and the like of the first human 112 and the second human 114 and take notes on whether the first human 112 and the second human 114 appear disgruntled, excited, insulted, and the like throughout the trial between the first human 112 and the second human 114.

The data stored and transmitted by the external device 130 may also be self-reported analysis from the first human 112 and the second human 114. For instance, during, or following a communication trial between the first human 112 and the second human 114, the first human 112 and/or the second human 114 may provide a self-analysis of their mental and emotional state during the trial. For instance, the first human 112 may report that they were insulted by a certain comment by the second human 114, that they were excited by the initial price of a vehicle in question but subdued the expressions of the excitement, that they did not trust the second human 114, and the like.

The above-described data, including the physiological data, voice or visual recordings, the administrator notes, the administrator analysis, and the self-reported analysis may collectively be referred to as trial data or stimulus data, herein. That is, the above-described data generally relates to the mental, emotional, and physiological response of the first human 112, for instance, in response to outside stimuli (such as the second human 114, the environment 110, etc.). The stimulus data, therefore, provides data on a human's reaction and behavior in response to different stimuli, when interacting with different humans, when interacting in different environments with different purposes, and the like.

The data stored and transmitted by the external device 130 on each of the first human 112 and the second human 114 may be stored in a profile for each of the first human 112 and the second human 114. That is, all data collected from all trials including the first human 112, whose name may be John Doe, may be stored in a profile specific to John Doe. Personal profile data of John Doe may also be stored in the John Doe profile. For instance, John Doe's sex, gender, age, religion, education, income level, marital status, and the like can be stored in the John Doe profile.

The John Doe profile may also include data on the values, personality traits, and the like of the John Doe. Such data may be collectively referred to as personality data herein. While the trial data may track John Doe's behavior, mental state, emotional state, thought, and the like during a communication trial with a second human 114, for instance, the personality data provides information on John Doe's baseline mental and emotional qualities. For instance, the personality data may include a quantification, on a scale of 0-10, for instance, on whether John Doe is trusting, easily insulted, frugal, spendthrift, honest, and the like. The personality data may be collected from a personality test completed by John Doe. The personality data may also be self-reported by John Doe. For instance, John Doe may be asked to rank how honest he is on a scale of 0-10. The personality data may also be observational data reported by the administrator. For instance, the administrator may observe John Doe to assemble subjective observational data on John Doe's baseline personality traits.

The above-described personal profile data and personality data may be described as baseline data herein, as the personal profile data and personality data relate to the starting qualities and traits of the first human 112, for instance, independent of any outside stimuli.

As noted, data may be uploaded to the external device 130 through one or more network connected devices connected to the network 120. For instance, an administrator, first human 112, or second human 114 may input data on their respective personal devices and upload the data to the external device 130. In some embodiments, the external device 130 includes an interface module, such as a display screen, that allows for an administrator or other individual to directly provide data to the external device 130 through the interface module of the external device 130.

It should be appreciated, however, that the external device 130 is not required for operation of the system 100. For instance, the trial data, personal profile data, personality data, and the like may be directly uploaded to and stored on the user device 140.

Still referring to FIGS. 1-2, the user device 140 comprises the interface module 146. The interface module 146 may be coupled to the communication path 208. The interface module 146 includes one or more user/machine interfaces to allow presentation of data or information to a user and/or allow for input of user information to the user device 140. For instance, the interface module 146 may include a visual interface 144. The visual interface 144 may be, for example, a cathode ray tube, light emitting diodes, a liquid crystal display, a plasma display, or the like. Moreover, the visual interface 144 may be a touchscreen that, in addition to providing an optical display, detects the presence and location of a tactile input upon a surface of or adjacent to the visual interface 144. The interface module 146 may also include audial interface 142. The audial interface 142 may include one or more speakers to output an audio message to a user. The audial interface 142 may also include a microphone to receive audio input, such as vocal commands, from a user.

Referring again to the memory module 204 of the controller 200 of the user device 140, the programming instructions stored in the memory module 204 may be embodied as a plurality of software logic modules, where each logic module provides programming instructions for completing one or more tasks. Each of the logic modules may be embodied as a computer program, firmware, or hardware, as an example. Illustrative examples of logic modules present in the memory module 204 include, but are not limited to, data receiving logic 210, human behavior model logic 212, task model logic 214, parameter logic 216, simulation logic 218, display logic 220, and training logic 222.

The data receiving logic 210 includes one or more programming instructions for receiving data from the external device 130. That is, the data receiving logic 210 includes programming to cause a connection between the network interface hardware 150 and the external device 130 such that data transmitted by the external device 130 is received by the controller 200. Further, the data transmitted by the external device 130 may be stored (e.g., within the data storage component 206). The data transmitted by the external device 130 may include any and all of the data discussed above.

The human behavior model logic 212 includes one or more programming instructions for building a model of human behavior for a simulated human. The model of human behavior may be constructed from data transmitted from the external device 130. That is, the model of human behavior may be trained on the dataset of interactions, or trials, between humans stored in the external device 130. The model of human behavior may be representative of the behavior of a single human. For instance, a user, through the interface module 146, may specify for the model of human behavior to be trained on the data specific to John Doe. Such data would include John Doe's baseline data and stimulus data (i.e. physiological, mental, emotional data) on John Doe in different trials.

The model of human behavior may be representative of the behavior of more than one human. For instance, a user, through the interface module 146, may specify for the model of human behavior to be trained on the specific data related to John Doe and the specific data related to Jane Doe. The model of human behavior may then represent an imaginary person that is a combination of the personality traits, or baseline data, of John Doe and Jane Doe, as well as a combination of the stimulus data of John Doe and Jane Doe (i.e. how they both react in response to different stimuli).

The user may also specify for the model of human behavior to be trained on data related to all persons in a certain category. For instance, the user may build a model of human behavior that is representative, or a combination of, all males 25-30 years old. Therefore, the controller 200 may receive all baseline and stimulus data on males aged 25-30 years old from the external device 130 to train the model of human behavior on. The model of human behavior is, therefore, representative of the average male in the age range of 25-30 years old. That is, the model of human behavior represents both the average baseline personality traits and stimulus data of males in the age range of 25-30 years old.

The task model logic 214 includes one or more programming instructions for building a model of a task to be engaged in by a plurality of simulated humans. The model of the task to be engaged in may include the goal of each simulated human in the model of the task to be engaged in. For instance, a goal of a first simulated human may be to purchase a car, and the goal of a second simulated human may be to sell a particular car. The model of the task to be engaged in may also include the context surrounding the goals of the first simulated human and the second simulated human, for instance. The context may be the internal monetary budget of the simulated human with the goal of purchasing the vehicle, the demand from external purchasers for the vehicle in question, the weather or time of year while the first simulated human and second simulated human interact, and the like.

The parameter logic 216 includes one or more programming instructions for receiving and executing instruction from the user to adjust one or more parameters of the model of human behavior and/or the model of a task to be engaged in by a plurality of simulated humans. For instance, before or after training the model of human behavior on a dataset of baseline data and stimulus data related to a single human, a combination of known humans, or a combination of humans in a population pool, the user may manually adjust and set a parameter of the model. The parameter may be honesty, irritability, or any other desirable personality or behavioral trait, for instance. Similarly, the user may adjust one or more parameters of the model of a task to be engaged in by a plurality of simulated humans. The parameters of the model of the task to be engaged in may generally relate to the context surrounding the goals of the first simulated human and the second simulated human. For instance, the user may manually adjust or set the internal budget of the simulated human with the goal of purchasing a vehicle.

The parameter logic 216 also includes one or more programming instructions for learning the parameters of the model of the task to be engaged in. For instance, the task to be engaged in may be the purchase/sale of a vehicle. The controller 200 may access all data stored in the external device collected during trials related to the sale/purchase of an item, or more specifically the sale/purchase of a vehicle. The data may be analyzed to learn the specific parameters that provide context for sale/purchase tasks. For instance, it may be learned that parameters that provide context for the task, or will influence the interactions between the simulated humans engaging in the task, are the budget of the purchaser, the number of interested third party buyers, whether the vehicle being purchased in new or used, whether the seller is a professional car salesman, whether the seller is a neighbor of the purchaser, and the like. It should be appreciated that the user may set the value of any or all of the learned parameters as desired.

The simulation logic 218 includes one or more programming instructions for simulating an interaction between a plurality of simulated humans based on the model of human behavior built for each simulated human and the model of the task to be engaged in by the plurality of simulated humans. The simulation logic 218 includes one or more programming instructions for building an avatar for each of the simulated humans. A model of human behavior may be applied to each avatar. The simulation logic 218 includes one or more programming instructions for simulating dialogue and/or non-verbal communication between the plurality of simulated humans as they engage in the task to be engaged in. The simulation logic 218 also includes one or more programming instructions for simulating both the physical appearance and internal emotional and mental states of the plurality of simulated humans. It should be appreciated that the internal emotional or mental state of a simulated human may, but not in all cases, manifest itself as a change in physical appearance of the simulated human.

The display logic 220 includes one or more programming instructions for displaying the simulation of the interaction between the plurality of simulated humans as they engage in the task to be engaged in. The simulation of the interaction between the plurality of simulated humans as they engage in the task to be engaged in may be displayed on the interface module 146. The display may be visual, audial, or a combination. Avatars may be displayed for each of the simulated humans. The appearance of the avatars may be updated and adjusted based on the simulation of the physical appearance and internal emotional and mental states of the simulated humans. Dialogue between the simulated humans may be visually displayed in a text box or audibly output through a speaker of the user device 140. The task to be engaged in may also be displayed on the interface module 146 in any desired detail. For instance, if the task to be engaged in the sale/purchase of a vehicle, the vehicle being negotiated over may be displayed. Additionally, any other contextual parameters of the task to be engaged in, such as the weather, environmental setting, and the like, may be displayed. One or more graphs, scales, or measurements may also be displayed. For instance, a numerical value or other graphical representation of an internal state, such as an emotion, of the simulated humans may be displayed and updated as the simulated humans engage in the task to be engaged in.

The training logic 222 includes one or more programming instructions for utilizing a neural network or other machine learning model to adjust or improve the operation of one or more other logic modules of the memory module 204. For instance, the training logic 222 may include programming to train the parameter logic 216 to improve the determination of contextual parameters for different tasks to be engaged in.

Still referring to FIGS. 1 and 2, data storage component 206 may generally be a storage medium. Data storage component 206 may contain one or more data repositories for storing data that is received and/or generated. The data storage component 206 may be any physical storage medium, including, but not limited to, a hard disk drive (HDD), memory, removable storage, and/or the like. While the data storage component 206 is depicted as a local device, it should be understood that the data storage component 206 may be a remote storage device, such as, for example, a server computing device, cloud based storage device, or the like. Illustrative data that may be contained within the data storage component 206 includes, but is not limited to, human behavior data, task data, parameter data, simulation data, display data, and training data.

The human behavior data may generally be data that is used by the controller 200 to build a model of human behavior. The task data may generally be data that is used by the controller 200 to build a model of a task to be engaged in. The parameter data may generally be data that is used by the controller 200 to learn parameters of a task and present parameters to a user to adjust. The simulations data may generally be data that is used by the controller 200 to simulate interactions between a plurality of simulated humans. The display data may generally be data that is used by the controller to display the simulated interactions between a plurality of simulated humans. The training data may generally be data that is generated as a result of one or more machine learning processes used to improve the accuracy of the model of human behavior, for instance.

Figure 3:
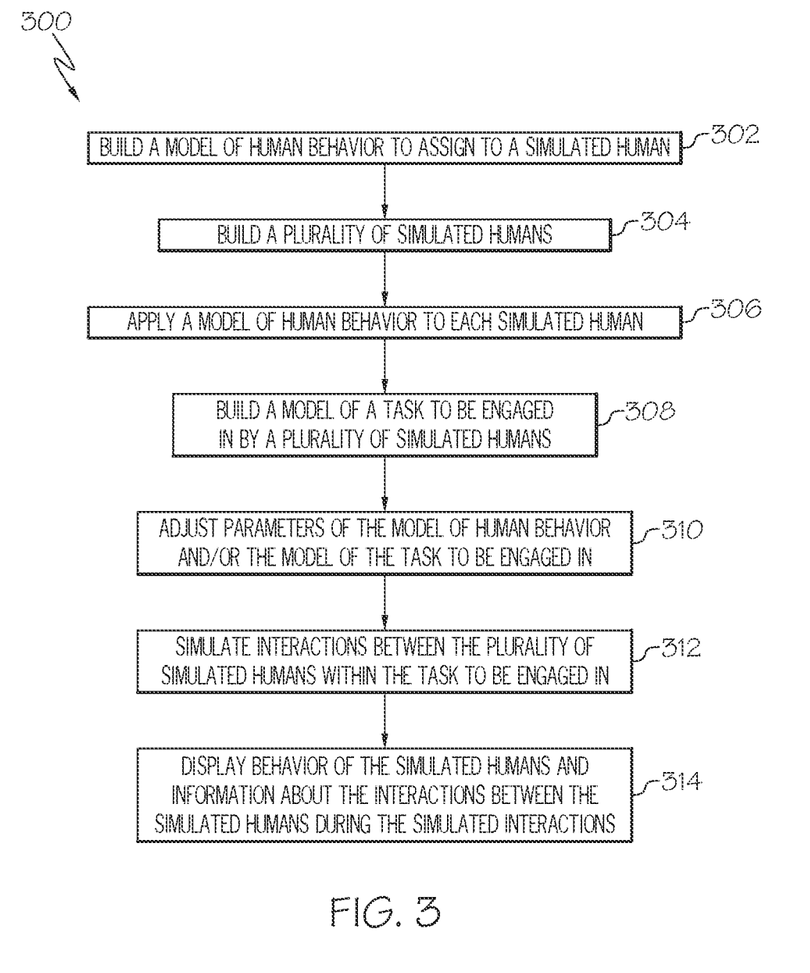
FIG. 3 depicts a flowchart for investigating interactions between simulated humans, according to one or more embodiments shown and described herein.
Figure 4:
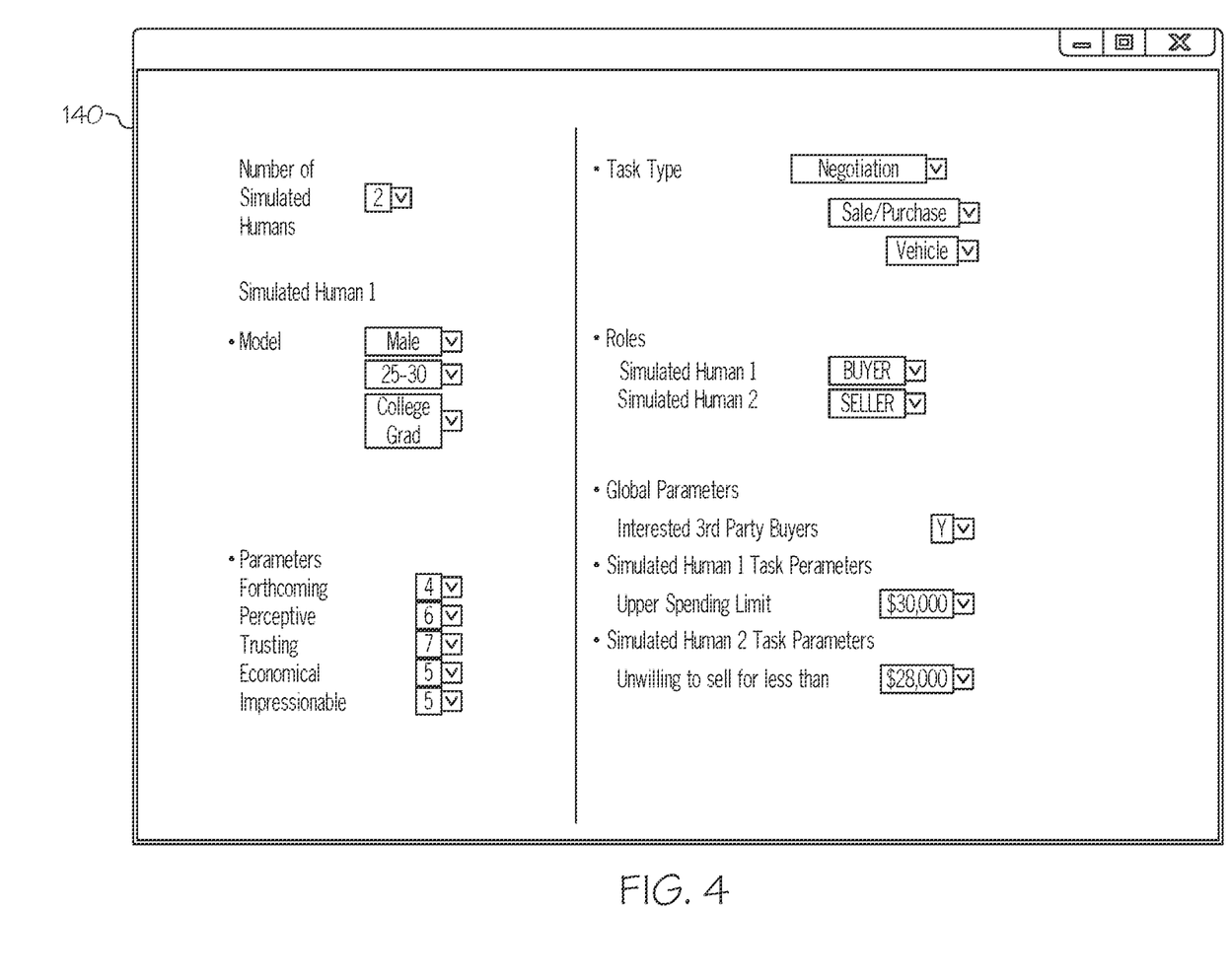
FIG. 4 schematically depicts an example interaction between a user and the system of FIG. 2 on a user device of the system of FIG. 2, according to one or more embodiments shown and described herein.
Figure 5:
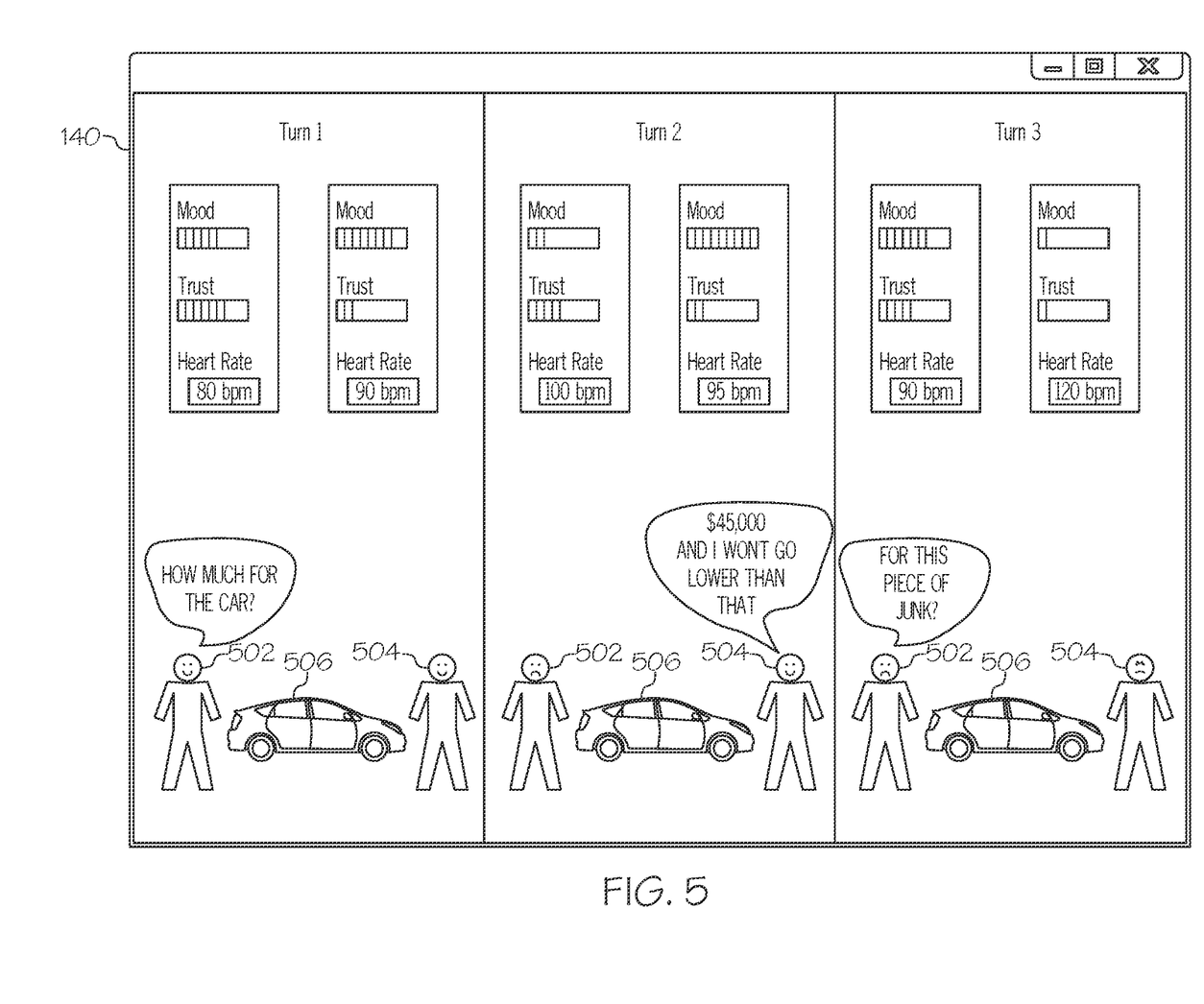
FIG. 5 schematically depicts an example simulation of interactions between simulated humans on a user device of the system of FIG. 2, according to one or more embodiments shown and described herein.

FIG. 3 depicts flowchart for a method 300 for investigating interactions between simulated humans. The method 300 may be executed based on instructions stored in the memory module 204 that are executed by the processor 202. FIG. 4 schematically depicts example user interactions with the user device 140 through the interface module 146 (FIG. 2), and FIG. 5 schematically depicts an example display of a simulated interaction between simulated humans through the interface module 146 (FIG. 2) according to the method 300 of operation of the system 100.

Referring now to FIGS. 1-4, at block 302 of the method 300, the system 100 builds a model of human behavior to assign to a simulated human. More particularly, the system 100 builds a model of human behavior to assign to each simulated human in the simulated interaction, respectively. A user may specify the stimulus and baseline data that each model of human behavior should be trained on respectively. For instance, as shown in FIG. 4, for a first simulated human, the user may specify that the model of human behavior should be trained on baseline and stimulus data collected on males that are 25-30 years old and college graduates. While three data specifiers (e.g. male, 25-30, college grad) are shown in FIG. 4, it should be appreciated that the user may select more or fewer data specifiers for the model of human behavior to be trained on. The data specifiers may be selected by the user from a drop-down menu, typed into the interface module 146, spoken into the interface module 146, or otherwise specified or selected in any desirable manner.

It should be appreciated that while FIG. 4 depicts the user specifying the data that the model of human behavior for the first simulated human is trained on, the user may take similar steps to specify the data that the model of human behavior for the second simulated human to be trained on. The data to train the model of human behavior for the second simulated human may be the same data as that used for the first simulated human, or different data. For instance, the model of human behavior for the second simulated human may be specified to be baseline and stimulus data for females, a specific person (i.e. John Doe), and the like. Similarly, the model of human behavior for the second simulated human may be trained on data including, but not limited to, the data the model of human behavior for the first simulated human is trained on. For instance, the user may specify that the model of human behavior should be trained on baseline and stimulus data collected on males that are 25-35 years old and college graduates.

Referring now to FIGS. 1-5, at block 304 of the method 300, the system 100 builds a plurality of simulated humans. For instance, as shown in FIG. 4, the user specifies for two simulated humans to be built. The system 100 may then build a first simulated human 502 and a second simulated human 504 depicted in FIG. 5. The simulated humans 502 and 504 may be avatars taking the general likeness of humans.

Still referring to FIGS. 1-5, at block 306 of the method 300, the system 100 applies a model of human behavior to each simulated human 502, 504, respectively. The model of human behavior for the first simulated human 502 may be applied to the first simulated human 502, and the model of human behavior for the second simulated human 504 may be applied to the second simulated human 504. The models of human behavior determine the baseline and stimulus attributes of the simulated humans 502, 504. For instance, the model of human behavior for the first simulated human 502 determines if, and to what extent, the first simulated human 502 is trusting, outspoken, confrontational, and the like. When applying the model of human behavior for the first simulated human 502 to the first simulated human 502, for instance, the system 100 may adjust the appearance of the first simulated human 502, to the extent possible, to represent the model of human behavior for the first simulated human 502. More specifically, the appearance of the first simulated human 502 may be adjusted to appear as a male in the 25-30 year old age range. The appearance of the second simulated human 504 may be similarly adjusted based on the model of human behavior applied to the second simulated human 504.

Still referring to FIGS. 1-5, at block 308 of the method 300, the system 100 builds a model of a task to be engaged in by the plurality of simulated humans 502, 504. The model of the task to be engaged in by the plurality of simulated humans 502, 504 includes the overarching type of interaction between the simulated humans 502, 504. For instance, the user may specify that the simulated humans 502, 504 engage in a negotiation. The user may further specify the type of negotiation to be engaged in. For instance, the model of the task to be engaged in will vary depending on whether the negotiation involves the sale/purchase of an item or a trade of items between the simulated humans 502, 504. The user may further specify the item to be negotiated over by the simulated humans 502, 504. As shown in FIG. 4, the item to be negotiated over is a vehicle. When building the model of the task to be engaged in, the user may further specify the roles of each simulated human 502, 504, and more particularly, the unique objective of each simulated human 502, 504 in the task (e.g. buy a car, sell a car).

The above is merely an example of a model of a task for the simulated humans 502, 504 to engage in. The task built by the system 100 may generally be any circumstance that the user wishes to observe the simulated humans 502, 504 navigate together. For instance, model of the task to be engaged in by the plurality of simulated humans 502, 504 may be an employment interview process, an allocation of jobs/roles in a group assignment, and the like. The model of the task to be engaged in by the plurality of simulated humans 502, 504 may also be purely social in nature. That is, the task need not result in a tangible allocation of goods, items, or positions among the plurality of simulated humans 502, 504. Instead, the task may merely be to engage in "small talk," for the simulated humans 502, 504 to acquaint themselves with each other, to build goodwill with each other, and the like. Therefore, the interactions of the simulated humans 502, 504 may be investigated in any desirable task.

Still referring to FIGS. 1-5, at block 310 of the method 300, the system 100 adjusts one or more parameters of the models of human behavior for the simulated humans 502, 504 and/or the model of the task to be engaged in by the simulated humans 502, 504. The system 100 may adjust the one or more parameters of the models of human behavior for the simulated humans 502, 504 and/or the model of the task to be engaged in by the simulated humans 502, 504 based on input received from the user. The parameters of the models of the human behavior for the simulated humans 502, 504 may be initially determined by the data each model of human behavior is trained on respectively. Parameters of the models of human behavior generally include the baseline and stimulus characteristics of the simulated human that the model is applied to. For example, parameters of the models of human behavior may include qualities such as, forthcoming, perceptive, trusting, economical, and impressionable. Specifically, the model of simulated human behavior for the first simulated human 502, trained on stimulus and baseline data from 25-30 year old male college graduates, may result in the parameters depicted in FIG. 4. That is, the simulated human 502, which the model is applied to, may have a forthcoming score of 4, on a scale of 0-10. The parameters need not be represented by numerical values. For instance, the parameters may be displayed by any visual or audial representation that can conveys a weight or magnitude of a parameter. The user may then selectively adjust all or any of the parameters of the models of human behavior, as desired. For instance, while the average 25-30 year old male college graduate may have a perceptive score of 6 out of 10, the user may selectively adjust the parameter of the model to a 4 out of 10, therefore decreasing the perceptiveness of the simulated human 502 that the model is applied to.

The user may also adjust the parameters of the model of the task to be engaged in by the simulated humans 502, 504. The parameters of the model of the task to be engaged in may be user generated. For instance, the user may self-generate interested third party buyers as a parameter affecting the task to be engaged in by the simulated humans 502, 504 and input a value for the parameter (e.g. no, yes, and/or number of third party buyers). The system 100 may also learn parameters that affect the task to be engaged in, and present the parameters to the user for the user to set as desired. For instance, the system 100 may learn that the number of interested third party buyers affects the task to be engaged in and present that parameter to the user for the user to set, as desired. The task to be engaged in parameters include parameters external to the simulated humans 502, 504, such as interested third party buyers. The task to be engaged in parameters may include parameters internal to the simulated humans 502, 504, such as an amount of money the first simulated human 502 will not spend over and an amount of money the second simulated human 504 will not sell for less than.

Still referring to FIGS. 1-5, at block 312 of the method 300, the system 100 simulates interactions between the plurality of simulated humans 502, 504 within the task to be engaged. At block 314 of the method 300, the system 100 displays behavior of the simulated humans 502, 504 and information about the interactions between the simulated humans 502, 504 during the simulated interactions. The system 100 may also display information on the task to be engaged in by the simulated humans. For instance, the system 100 may display a vehicle 506 and any other contextual or environmental parameters affecting the task to be engaged in.

The system 100 may simulate both verbal and non-verbal interactions between the simulated humans 502, 504. For instance, the simulation may begin with a first "turn." In a first turn, the first simulated human 502 or the second simulated human 504 may begin the interaction with some action or communication. As shown in FIG. 5, the first simulated human 502 asks the second simulated human 504, "How much for the car?" This communication may be displayed by the system 100 as a text box or may be output through speakers of the interface module 146.

At the beginning of the first turn, the first simulated human 502 and the second simulated human 504 may begin the simulation based on the baseline data incorporated into the respective models of human behavior applied to the first simulated human 502 and the second simulated human 504. These internal mental, emotional, or physiological states may be displayed by the system 100. For instance, the system may graphically display scales showing the overall mood of the first simulated human 502 and the second simulated human 504, and the trust each simulated human 502, 504 has in the other. The system 100 also displays a numerical value for the heart rate of each simulated human 502, 504.

After the completion of the first turn, a second turn in the simulation may begin with the second simulated human 504 responding to the question posed by the first simulated human 502 in the first turn. While each turn is depicted in FIG. 5 as a discrete or still display, this need not be the case. For instance, the display of the simulation may fluidly change with each turn and action taken by the simulated humans 502, 504. In other words, the display of the first turn may change into the display of the second turn, and so on. In such cases, the first turn does not remain as a discrete visual display on the user device 140.

As the simulation continues, the internal mental, emotional, or physiological states of the simulated humans 502, 504 are updated based on the communications of the other of the simulated humans 502, 504 and possible changes in the context of the task to be engaged in. For instance, the graphics depicting the mood, trust, and heart rate of the of the simulated human 502, 504 will update as the simulated humans 502, 504 become angry, distressed, insulted, hopeful for a resolution to the task, and the like. The avatar of the simulated humans 502, 504 may also be updated in appearance during the simulation. The change in appearance of the avatars may reflect the internal mental, emotional, or physiological state of each simulated human 502, 504. The change in appearance may also relate to a non-verbal action taken by the simulated humans 502, 504. For instance, the first simulated human 502 may be excited by the price the second simulated human 504 is offering on the vehicle. However, the first simulated human 502 may not wish to physically express such excitement to the second simulated human 504. In such cases, the avatar of the first simulated human 502 will take the outward appearance as intended by the first simulated human 502 during the negotiation. The system 100 may also simulate concrete physical actions, such as one of the simulated humans 502, 504 walking away from the other.

The system therefore allows a user to investigate and observe, in real time, how two simulated humans, possessing desired characteristics, interact with each other during a simulated task, also possessing desired characteristics. The user may control all variables or parameters of the models of human behavior and model of the task to be engaged in except one, to determine the affect that particular variable has on the interactions between the simulated humans 502, 504. It should be appreciated that each simulation and display of the simulation may be stored on the data storage component 206 for future play back and statistical analysis, for instance.

It should be appreciated that the method 300 discussed above is not limited to the order of steps presented in FIG. 3. For instance, in some embodiments, plurality of simulated humans at block 304 may be built prior to the model of human behavior to assign to a simulated human at block 302. It should also be appreciated that steps presented in FIG. 3 need to not be discrete in all embodiments. That is, the system 100 may build a plurality of simulated humans at block 304 and apply a model of human behavior to each simulated human at block 306 substantially simultaneously, such that blocks 308 and 310 may be considered a single step in method 300. Moreover, it should be appreciated that one or more steps of the method 300 depicted in FIG. 3 may be omitted from the method 300. For instance, in some embodiments, the user need not adjust the parameters of the model of human behavior or the model of the task to be engaged in at block 310. Additionally, one or more steps not presented in the method 300 depicted in FIG. 3 may be completed by the system 100

Based on the foregoing, it should now be understood that embodiments shown and described herein relate to systems and methods for investigating interactions between simulated humans. The system builds a model of human behavior that can be assigned to a simulated human. The model of human behavior is trained on a dataset of interactions between humans. Parameters of the model of human behavior may be adjusted by a user. Accordingly, depending on the dataset used to train each model of human behavior and the selective adjustment of one or more parameters of the model, a user can accurately control, isolate, and investigate personality variables of the simulated human. The system also builds a model of a task to be engaged in by a plurality of simulated humans. The task may include a goal to be achieved by each of the plurality of simulated humans. The user may also adjust parameters of the model of the task to be engaged in to allow the user to accurately control, isolate, and investigate environmental or contextual variables in the task to be engaged in. The system simulates interactions between the plurality of simulated humans. Throughout the simulation, the system displays behavior of the simulated humans and information about the interactions between the simulated humans, such as their internal emotional, mental, or physiological states.

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. When the term "about" is used in describing a value or an end-point of a range, the specific value or end-point referred to is included. Whether or not a numerical value or end-point of a range in the specification recites "about," two embodiments are described: one modified by "about," and one not modified by "about." It will be further understood that the endpoints of each of the ranges are significant both in relation to the other endpoint, and independently of the other endpoint.

Directional terms as used herein—for example up, down, right, left, front, back, top, bottom—are made only with reference to the figures as drawn and are not intended to imply absolute orientation.

Unless otherwise expressly stated, it is in no way intended that any method set forth herein be construed as requiring that its steps be performed in a specific order, nor that with any apparatus specific orientations be required. Accordingly, where a method claim does not actually recite an order to be followed by its steps, or that any apparatus claim does not actually recite an order or orientation to individual components, or it is not otherwise specifically stated in the claims or description that the steps are to be limited to a specific order, or that a specific order or orientation to components of an apparatus is not recited, it is in no way intended that an order or orientation be inferred, in any respect. This holds for any possible non-express basis for interpretation, including: matters of logic with respect to arrangement of steps, operational flow, order of components, or orientation of components; plain meaning derived from grammatical organization or punctuation, and; the number or type of embodiments described in the specification.

As used herein, the singular forms "a," "an" and "the" include plural referents unless the context clearly dictates otherwise. Thus, for example, reference to "a" component includes aspects having two or more such components, unless the context clearly indicates otherwise.

For the purposes of describing and defining the present subject matter, it is noted that reference herein to a variable being a "function" of a parameter or another variable is not intended to denote that the variable is exclusively a function of the listed parameter or variable. Rather, reference herein to a variable that is a "function" of a listed parameter is intended to be open ended such that the variable may be a function of a single parameter or a plurality of parameters.

It is noted that recitations herein of a component of the present disclosure being "configured" or "programmed" in a particular way, to embody a particular property, or function in a particular manner, are structural recitations, as opposed to recitations of intended use. More specifically, the references herein to the manner in which a component is "programmed" or "configured" denotes an existing physical condition of the component and, as such, is to be taken as a definite recitation of the structural characteristics of the component.

It is noted that terms like "preferable," "typical," and "suitable" when utilized herein, are not utilized to limit the scope of the claimed subject matter or to imply that certain features are critical, essential, or even important to the structure or function of the claimed subject matter. Rather, these terms are merely intended to identify particular aspects of an embodiment of the present disclosure or to emphasize alternative or additional features that may or may not be utilized in a particular embodiment of the present disclosure.

For the purposes of describing and defining the present subject matter it is noted that the terms "substantially" and "approximately" are utilized herein to represent the inherent degree of uncertainty that may be attributed to any quantitative comparison, value, measurement, or other representation. The terms "substantially" and "approximately" are also utilized herein to represent the degree by which a quantitative representation may vary from a stated reference without resulting in a change in the basic function of the subject matter at issue.

Having described the subject matter of the present disclosure in detail and by reference to specific embodiments thereof, it is noted that the various details disclosed herein should not be taken to imply that these details relate to elements that are essential components of the various embodiments described herein, even in cases where a particular element is illustrated in each of the drawings that accompany the present description. Further, it will be apparent that modifications and variations are possible without departing from the scope of the present disclosure, including, but not limited to, embodiments defined in the appended claims. More specifically, although some aspects of the present disclosure are identified herein as preferred or particularly advantageous, it is contemplated that the present disclosure is not necessarily limited to these aspects.

What is claimed is:

1. A system, comprising a processor configured to:
   build a model of human behavior that can be assigned to a simulated human, wherein the model is trained on a dataset of interactions between humans, and parameters of the model of human behavior comprise baseline personality traits of the humans and stimulus characteristics related to mental, emotional, and physiological responses of the humans, and can be adjusted;
   build a model of a task to be engaged in by a plurality of simulated humans;
   simulate interactions between the plurality of simulated humans;
   adjust one or more parameters of the model of human behavior;
   monitor disparate internal emotional and mental states of the simulated humans during the simulated interactions;
   adjust an appearance and behavior of the simulated humans based on a simulation of the disparate internal emotional and mental states of the simulated humans, and an intent to physically express the disparate internal emotional and mental states during the simulated interactions; and
   display the appearance, the behavior, and the disparate internal emotional and mental states of the simulated humans and information about the interactions between the simulated humans during simulated interactions in real time.

2. The system of claim 1, wherein the dataset of interactions between humans comprises:
   observational data of interactions between humans; or
   physiological data of humans during interactions between humans.

3. The system of claim 1, wherein the task comprises a goal to be achieved by each of the plurality of simulated humans.

4. The system of claim 1, wherein parameters of the model of the task to be engaged in may be adjusted.

5. The system of claim 1, wherein the processor is further configured to learn parameters of the model of the task to be engaged in.

6. The system of claim 1, wherein the processor is further configured to adjust the one or more parameters of the model of human behavior based on an input received from a user.

7. The system of claim 1, wherein the processor is further configured to adjust the model of the task to be engaged in by the plurality of simulated humans based on an input received from a user.

8. A method implemented by a processor of a device, the method comprising: building a model of human behavior that can be assigned to a simulated human, wherein the model is trained on a dataset of interactions between humans, and parameters of the model of human behavior comprise baseline personality traits of the humans and stimulus characteristics related to mental, emotional, and physiological responses of the humans, and can be adjusted; building a model of a task to be engaged in by a plurality of simulated humans; simulating interactions between the plurality of simulated humans; adjusting one or more parameters of the model of human behavior; monitoring disparate internal emotional and mental states of the simulated humans during the simulated interactions; adjusting an appearance and behavior of the simulated humans based on a simulation of the disparate internal emotional and mental states of the simulated humans, and an intent to physically express the disparate internal emotional and mental states during the simulated interactions; and displaying the appearance, the behavior, and the disparate internal emotional and mental states of the simulated humans and information about the interactions between the simulated humans during simulated interactions in real time.

9. The method of claim 8, wherein the dataset of interactions between humans comprises:
   observational data of interactions between humans; or
   physiological data of humans during interactions between humans.

10. The method of claim 8, wherein the one or more parameters of the model of human behavior are adjusted based on an input received from a user.

11. The method of claim 8, further comprising adjusting the model of the task to be engaged in by the plurality of simulated humans based on an input received from a user.

12. A processor of a computing device, the processor configured to: build a model of human behavior that can be assigned to a simulated human, wherein the model is trained on a dataset of interactions between humans, and parameters of the model of human behavior comprise baseline personality traits of the humans and stimulus characteristics related to mental, emotional, and physiological responses of the humans, and can be adjusted; build a model of a task to be engaged in by a plurality of simulated humans; simulate interactions between the plurality of simulated humans; adjust one or more parameters of the model of human behavior; monitor disparate internal emotional and mental states of the simulated humans during the simulated interactions; adjust an appearance and behavior of the simulated humans based on a simulation of the disparate internal emotional and mental states of the simulated humans, and an intent to physically express the disparate internal emotional and mental states during the simulated interactions; and display the appearance, the behavior, and the disparate internal emotional and mental states of the simulated humans and information about the interactions between the simulated humans during simulated interactions in real time.

13. The processor of claim 12, wherein the dataset of interactions between humans comprises:
   observational data of interactions between humans; or
   physiological data of humans during interactions between humans.

14. The processor of claim 12, wherein the processor is further configured to adjust the one or more parameters of the model of human behavior based on an input received from a user.

15. The processor of claim 12, wherein the processor is further configured to adjust the model of the task to be engaged in by the plurality of simulated humans based on an input received from a user.

* * * * *

UNITED STATES PATENT AND TRADEMARK OFFICE
CERTIFICATE OF CORRECTION

PATENT NO. : 12,210,808 B2
APPLICATION NO. : 17/470727
DATED : January 28, 2025
INVENTOR(S) : Matthew Lee et al.

It is certified that error appears in the above-identified patent and that said Letters Patent is hereby corrected as shown below:

In the Specification

In Column 5, Line 5, after "may", delete "be".

In Column 5, Line 53, after "label", delete "the".

In Column 9, Line 23, after "purchased", delete "in" and insert --is--, therefor.

In Column 12, Line 47, delete "conveys" and insert --convey--, therefor.

In Column 14, Line 19, delete "affect" and insert --effect--, therefor.

Signed and Sealed this
Eighteenth Day of March, 2025

Coke Morgan Stewart
*Acting Director of the United States Patent and Trademark Office*